US008969703B2

(12) United States Patent
Makansi et al.

(10) Patent No.: US 8,969,703 B2
(45) Date of Patent: Mar. 3, 2015

(54) DISTRIBUTED THERMOELECTRIC STRING AND INSULATING PANEL

(75) Inventors: Tarek Makansi, Tucson, AZ (US); Steve Wood, Tucson, AZ (US); John L. Franklin, Tucson, AZ (US); Mark N. Evers, Tucson, AZ (US)

(73) Assignee: Tempronics, Inc., Tucson, AZ (US)

( * ) Notice: Subject to any disclaimer, the term of this patent is extended or adjusted under 35 U.S.C. 154(b) by 629 days.

(21) Appl. No.: 13/101,015

(22) Filed: May 4, 2011

(65) Prior Publication Data

US 2012/0060885 A1 Mar. 15, 2012

Related U.S. Application Data

(60) Provisional application No. 61/403,217, filed on Sep. 13, 2010, provisional application No. 61/417,380, filed on Nov. 26, 2010, provisional application No. 61/433,489, filed on Jan. 17, 2011, provisional application No. 61/470,039, filed on Mar. 31, 2011.

(51) Int. Cl.
*H01L 35/04* (2006.01)
*H01L 35/34* (2006.01)
(Continued)

(52) U.S. Cl.
CPC ............... *H01C 7/008* (2013.01); *H01L 35/32* (2013.01); *H01C 1/16* (2013.01)
USPC ........... 136/204; 136/200; 136/201; 136/206; 136/212; 136/225

(58) Field of Classification Search
CPC ........... H01C 1/16; H01C 7/008; H01L 35/32
USPC .......................... 136/200, 204, 206, 212, 225
See application file for complete search history.

(56) References Cited

U.S. PATENT DOCUMENTS 2,796,532 A 6/1957 Teague et al. ................. 250/213
3,129,345 A 4/1964 Hatsopoulos et al. ........ 310/306
(Continued)

FOREIGN PATENT DOCUMENTS

DE 4010909 10/1991 ............. H01J 21/04
EP 1612492 1/2006 ............. F25B 21/00
(Continued)

OTHER PUBLICATIONS

Lauterbach, "Smart Clothes Self-Powered by Body Heat", Avantex Symposium, 2002.*
(Continued)

*Primary Examiner* — Matthew Martin
(74) *Attorney, Agent, or Firm* — Hayes Soloway P.C.

(57) ABSTRACT

Inexpensive, lightweight, flexible heating and cooling panels with highly distributed thermoelectric elements are provided. A thermoelectric "string" is described that may be woven or assembled into a variety of insulating panels such as seat cushions, mattresses, pillows, blankets, ceiling tiles, office partitions, under-desk panels, electronic enclosures, building walls, refrigerator walls, and heat conversion panels. The string contains spaced thermoelectric elements which are thermally and electrically connected to lengths of braided, meshed, stranded, foamed, or otherwise expandable and compressible conductor. The elements and a portion of compacted conductor are mounted within the insulating panel On the outsides of the panel, the conductor is expanded to provide a very large surface area of contact with air or other medium for heat absorption on the cold side and for heat dissipation on the hot side.

22 Claims, 9 Drawing Sheets

(51) Int. Cl.
  *H01C 17/00* (2006.01)
  *H01L 35/28* (2006.01)
  *H01C 7/00* (2006.01)
  *H01L 35/32* (2006.01)
  *H01C 1/16* (2006.01)

(56) References Cited

U.S. PATENT DOCUMENTS

| | | | |
|---|---|---|---|
| 3,173,032 A | 3/1965 | Maynard | 310/306 |
| 3,196,524 A | 7/1965 | Jamison | 29/155.5 |
| 3,217,189 A | 11/1965 | Bloss | 310/306 |
| 3,627,988 A | 12/1971 | Romaniec | 219/529 |
| 4,343,993 A | 8/1982 | Binnig et al. | 250/306 |
| 4,625,394 A | 12/1986 | Kemnitz et al. | 29/611 |
| 4,820,903 A | 4/1989 | Ishida | 219/213 |
| 4,825,488 A | 5/1989 | Bedford | 5/469 |
| 4,825,868 A | 5/1989 | Susa et al. | 128/376 |
| 5,028,835 A | 7/1991 | Fitzpatrick | 313/14 |
| 5,541,464 A | 7/1996 | Johnson et al. | 310/306 |
| 5,594,534 A | 1/1997 | Genovese | 399/285 |
| 5,892,656 A * | 4/1999 | Bass | 361/699 |
| 6,064,137 A | 5/2000 | Cox | 310/306 |
| 6,129,990 A | 10/2000 | Frater | 428/607 |
| 6,323,413 B1 * | 11/2001 | Roth et al. | 136/201 |
| 6,385,976 B1 | 5/2002 | Yamamura et al. | 62/3.7 |
| 6,494,048 B1 | 12/2002 | Ghoshal et al. | 62/3.7 |
| 6,501,055 B2 * | 12/2002 | Rock et al. | 219/545 |
| 6,582,456 B1 | 6/2003 | Hand et al. | 607/104 |
| 6,639,242 B1 | 10/2003 | Chen et al. | 257/19 |
| 6,651,760 B2 | 11/2003 | Cox et al. | 180/65.3 |
| 6,720,704 B1 | 4/2004 | Tavkhelidze et al. | 310/306 |
| 6,774,003 B2 | 8/2004 | Tavkhelidze et al. | 310/306 |
| 6,863,981 B2 | 3/2005 | McBain | 428/412 |
| 6,876,123 B2 | 4/2005 | Martinovsky et al. | 310/306 |
| 6,884,732 B2 | 4/2005 | Najafi et al. | 438/713 |
| 6,946,596 B2 | 9/2005 | Kucherov et al. | 136/205 |
| 7,005,381 B1 | 2/2006 | Cox | 438/689 |
| 7,140,102 B2 | 11/2006 | Taliashvili et al. | 29/842 |
| 7,253,549 B2 | 8/2007 | Tavkhelidze et al. | 310/306 |
| 7,305,839 B2 | 12/2007 | Weaver, Jr. | 62/132 |
| 7,456,543 B2 | 11/2008 | Makansi | 310/306 |
| 2001/0046749 A1 | 11/2001 | Tavkhelidze et al. | 438/380 |
| 2002/0170172 A1 | 11/2002 | Tavkhelidze et al. | 29/842 |
| 2003/0042819 A1 | 3/2003 | Martinovsky et al. | 310/306 |
| 2003/0141455 A1* | 7/2003 | Lambert et al. | 250/353 |
| 2003/0184188 A1 | 10/2003 | Kucherov et al. | 310/306 |
| 2004/0050415 A1 | 3/2004 | Kucherov et al. | 136/252 |
| 2004/0195934 A1 | 10/2004 | Tanielian | 310/306 |
| 2005/0050415 A1 | 3/2005 | Anand et al. | 714/726 |
| 2005/0184603 A1 | 8/2005 | Martsinovsky | 310/49 |
| 2005/0189871 A1 | 9/2005 | Tavkhelidze et al. | 313/446 |
| 2006/0000226 A1 | 1/2006 | Weaver, Jr. | 62/132 |
| 2006/0038290 A1 | 2/2006 | Tavkhelidze et al. | 257/734 |
| 2006/0138896 A1 | 6/2006 | Makansi | 310/306 |
| 2006/0162761 A1 | 7/2006 | Tanielian | 136/205 |
| 2006/0180829 A1 | 8/2006 | Martsinovsky | 257/104 |
| 2006/0192196 A1 | 8/2006 | Tavkhelidze et al. | 257/30 |
| 2006/0207643 A1 | 9/2006 | Weaver, Jr. | 136/205 |
| 2007/0023077 A1 | 2/2007 | Tanielian | 136/201 |
| 2007/0033782 A1 | 2/2007 | Taliashvili et al. | 29/25.02 |
| 2007/0056623 A1 | 3/2007 | Tavkhelidze et al. | 136/205 |
| 2007/0069357 A1 | 3/2007 | Weaver et al. | 257/686 |
| 2007/0112390 A1 | 5/2007 | Lau et al. | 607/37 |
| 2007/0137687 A1 | 6/2007 | Tanielian | 136/205 |
| 2007/0181913 A1* | 8/2007 | Li | 257/14 |
| 2007/0289620 A1 | 12/2007 | Stark | 136/205 |
| 2007/0295973 A1 | 12/2007 | Jinbo et al. | 257/88 |
| 2008/0017237 A1 | 1/2008 | Bray et al. | 136/224 |
| 2008/0029146 A1* | 2/2008 | Plissonnier et al. | 136/242 |
| 2008/0042163 A1 | 2/2008 | Weaver, Jr. | 257/108 |
| 2008/0155981 A1 | 7/2008 | Tanielian | 60/527 |
| 2008/0173022 A1 | 7/2008 | Petrovski | 62/3.2 |
| 2009/0025774 A1* | 1/2009 | Plissonnier et al. | 136/224 |
| 2009/0205695 A1 | 8/2009 | Makansi | 136/201 |
| 2009/0229648 A1 | 9/2009 | Makansi | 136/201 |
| 2009/0283124 A1 | 11/2009 | Seo | 136/201 |
| 2009/0322221 A1 | 12/2009 | Makansi | 313/523 |
| 2010/0107657 A1 | 5/2010 | Vistakula | 62/3.5 |
| 2011/0016886 A1 | 1/2011 | Ghoshal et al. | 62/3.2 |
| 2011/0139203 A1 | 6/2011 | Yap | 136/205 |
| 2012/0060885 A1 | 3/2012 | Makansi et al. | 136/206 |
| 2013/0014796 A1 | 1/2013 | Tajima | 136/203 |

FOREIGN PATENT DOCUMENTS

| | | | |
|---|---|---|---|
| JP | 2003209297 A * | 7/2003 | |
| WO | WO9913562 | 3/1999 | H02N 2/00 |
| WO | WO2007078048 | 7/2007 | A45D 1/04 |
| WO | WO2008027928 | 3/2008 | H01J 1/02 |
| WO | WO2009102706 | 8/2009 | H01L 35/34 |
| WO | WO2010078521 | 7/2010 | H01L 35/34 |

OTHER PUBLICATIONS

PCT International Search Report and the Written Opinion, dated Dec. 23, 2011 (11 pgs).

PCT International Search Report and the Written Opinion issued for PCT/US2012/071838, dated Mar. 8, 2013 (10 pgs).

Official Action issued in U.S. Appl. No. 12/376,254, dated Jun. 29, 2011 (23 pgs).

Mexican Office Action issued corresponding Mexican Patent Application Serial No. MX/a/2013/002569 dated Jun. 13, 2013, 3 pgs.

*Skin Cooling Surfaces: Estimating the Importance of Limiting Skin Temperature*, By Charles Lachenbruch, Ostomy Wound Management. Feb. 2005 (8 pgs).

International Search Report and Written Opinion issued in related application No. PCT/US2013/050378, dated Dec. 30, 2013 (8 pgs).

International Preliminary Report on Patentability issued in related application No. PCT/US2012/045443, dated Jan. 16, 2014 (6 pgs).

Mexican Office Action issued in related application No. MX/a/2013/009378, dated Mar. 27, 2014 (2 pgs).

*The Thermoelectric Properties and Crystallography of Bi—Sb—Te—Se Thin Films Grown by Ion Beam Sputtering*, By H. Noro, K. Sato, and H. Kagechika, Journal of Applied Physics, 73 (3) Feb. 1, 1993.

*Efficient Switched Thermoelectric Refrigerators for Cold Storage Applications*, By Ghoshal and Guha, Journal of Electronic Materials, vol. 38, No. 7, 2009.

*Vacuum Thermionic Refrigeration with a Semiconductor Heterojunction Structure*, by Y. Hishinuma, T.H. Geballe, B.Y. Moyzhes, Applied Physics Letters, vol. 81, No. 22, Nov. 25, 2002.

*Measurements of Cooling by Room Temperature Thermionic Emission Across a Nanometer Gap*, by Y. Hishinuma, T.H. Geballe, B.Y. Moyzhes, and T.W. Kenny, Journal of Applied Physics, vol. 94, No. 7, Oct. 1, 2003.

*Thermionic Refrigeration*, By G.D. Mahan, Journal of Applied Physics, vol. 76, No. 7, Oct. 1, 1994.

*Multilayer Thermionic Refrigerator*, By G.D. Mahan, J.A. Sofao and M. Bartkoiwak, Journal of Applied Physics, vol. 83, No. 9, May 1, 1998.

Analysis of Nanonmeter Vacuum Gap Formation in Thermo-tunneling Devices, by E T Enikov and T Makansi, *Nanotechnology Journal*, 2008.

*Refrigeration by Combined Tunneling and Thermionic Emission in a Vacuum: Use of Nanometer Scale Design*, by Y. Hishinuma, T.H. Geballe, B.Y. Moyzhes, Applied Physics Letters, vol. 78, No. 17, Apr. 23, 2001.

*Design and Characterization of Thin Film Microcoolers*, Chris LaBounty, Ali Shakouri, John E. Bowers, Journal of Applied Physics, vol. 89, No. 7, Apr. 1, 2001.

*Possible Cooling* by Resonant Fowler-Nordheim Emission, A.N. Korotkov and K.K. Likharev, Applied Physics Letters, vol. 75, No. 16, Aug. 23, 1999.

*Quantum, Cyclic, and Particle-Exchange Heat Engines*, Humphrey et al., Physica E29, 390-398, 2005.

*Micron-gap ThermoPhotoVoltaics (MTPV)*, by R. DiMatteo, P. Greiff, D. Seltzer, D. Meulenberg, E. Brown, E. Carlen, K. Kaiser, S. Finberg, H. Nguyen, J. Azarkevich, P. Baldasaro, J. Beausang, L. Danielson, M. Dashiell, D. DePoy, E. Ehsani, W. Topper, K. Rahner, (56) References Cited

OTHER PUBLICATIONS

R. Siergie, Thermophotovoltaic Generation of Electricity Sixth Conference, American Institute of Physics, 2004.
*Thermal and electrical properties of Czochralski grown GeSi single crystals*, by I. Yonenaga et al. Journal of Physics and Chemistry of Solids 2001.
*Thermotunneling Based on Cooling Systems for High Efficiency Buildings*, by Marco Aimi, Mehmet Arik, James Bray, Thomas Gorczyca, Darryl Michael, and Stan Weaver General Electric Global Research Center, DOE Report Identifier DE-FC26-04NT42324, 2007.
*Selective Epitaxial Growth of SiGe on a SOI Substrate by Using Ultra-High Vacuum Chemical Vapor Deposition*, by H. Choi, J. Bae, D. Soh, and S. Hong, Journal of the Korean Physical Society, vol. 48, No. 4, Apr. 2006, pp. 648-652.
*Strain relaxation of SiGe Islands on Compliant Oxide*, by H. Yin et al., Journal of Applied Physics, vol. 91, No. 12, Jun. 15, 2002.
*Complex Thermoelectric Materials*, By G. J. Snyder and E. S. Tober, Nature Materials, vol. 7 Feb. 2008.
*Substrate-Mediated Photo Induced Chemical Reactions on Ultrathin Metal Films*, V.P. Zhdanov, B. Kasemo, Department of Applied Physics, Apr. 19, 1999, Surface Science 432 (1999) L599-L603.
*Bismuth Telluride ($Bi_2Te_3$)Nanowires: Synthesis by Cyclic Electrodeposition/Stripping, Thinning by Electrooxidation, and Electrical Power Generation*, E. J. Menke et al, Langmuir 2006, 22, 10564-10574, Jun. 30, 2006.
*Electronic Properties of Bismuth Nanowires*, By Stephen B. Cronin et al., Dept of Physics, Electrical Engineering and Computer Science, Chemistry and Francis Bitter Magnet Laboratory, Massachusetts Institute of Technology, Cambridge, MA 02139.
*Electroplating of Conformal Electrodes for Vacuum Nanogap Tunnel Junction*, By Jangidze et al., Tbilisi State University, Chavchavadze Ave. 13, 0179, Georgia, Nov. 2008, pp. 1-11.
European Supplementary Search Report, issued Oct. 22, 2010, Appln No. 077814511.7-2208/2057659, PCT/US2007077042 (8 pgs).
International Preliminary Report on Patentability, PCT/US07/07042, Mar. 12, 2009 (4 pgs).
International Search Report and Written Opinion issued in PCT/US07/77042, dated Sep. 5, 2008. (3 pgs).
International Search Report and Written Opinion, PCT/US07/60871, Jan. 22, 2007 (7 pgs).
International Search Report and Written Opinion, PCT/US09/69959, Mar. 15, 2010 (9 pgs).
Official Action dated Apr. 7, 2011 issued in related U.S. Appl. No. 12/302,782 (16 pgs).
European Communication, issued May 27, 2011, Appln. No. 07 756 398.9-2208 (3 pgs).
European Communication, issued Jun. 1, 2011, Appln. No. 07 814 511.7-2208 (3 pgs).
Australian Examination Report No. 1 issued in related application No. 2011302303, dated Aug. 19, 2013 (4 pgs).
Office Action issued in related U.S. Appl. No. 13/394,288, dated Nov. 14, 2013 (26 pgs).

\* cited by examiner

FIG. 1
Thermoelectric "String"

FIG. 2
Circuit board assembly and cut-out
of pellets or thermo-tunneling vacuum tubes FIG. 3
Configurations for weaving string into insulating panel FIG. 4a
Two-stage distributed
thermoelectric panels
with alternating weave FIG. 4b
Two-stage distributed
thermoelectric panel
with single-side weave FIG. 5
Top view of panel showing
expanded wire or metal foam FIG. 6
Different types of expanded or expandable metal FIG. 7
Experimental apparatus and data
showing performance of distributed thermoelectric panel FIG. 8
Other applications of distributed thermoelectric panel FIG. 9
Low cost power generation with distributed thermoelectric panel

DISTRIBUTED THERMOELECTRIC STRING AND INSULATING PANEL

CROSS REFERENCE TO RELATED APPLICATIONS

This application claims priority from U.S. Provisional Application Ser. No. 61/403,217, filed Sep. 13, 2010; U.S. Provisional Application Ser. No. 61/417,380, filed Nov. 26, 2010, U.S. Provisional Application Ser. No. 61/433,489, filed Jan. 17, 2011, and from U.S. Provisional Application Ser. No, 61/470,039 filed Mar. 31, 2011, the contents of which are incorporated herein by reference.

BACKGROUND

Cooling and Heating

Thermoelectric modules typically contain densely packed elements spaced apart by 1-3 mm. Up to 256 such elements are connected in an array that is 2×2 inches (5.08×5.08 cm) in area. When these modules are deployed, large and heavy heat sinks and powerful fans are required to dissipate or absorb the heat on each side. The reasons for these dense prior art configurations are well-founded: small elements with low resistance allow larger current I to flow before the resistive heat ($I^2R$) generated destroys the thermoelectric cooling ($pI1$ where p=Peltier coefficient). The use of short elements for maximum cooling capacity results in the hot and cold side circuit boards being close together. This proximity results in the high density.

To achieve a low density packing of thermoelectric elements, one could space out these elements on the boards laterally, but then the backflow of heat conducted and radiated through the air between the elements limits the overall performance. Some designs require evacuating the module interior to reduce heat backflow due to air conduction, but vacuum cavities require expensive materials and are prone to leaks. Vacuum materials (like glass and Kovar™) are also hard and easily broken when thin enough to limit their own backflow of heat. Broken glass can lead to safety issues when these modules are used in seat cushions, automobiles, and other environments.

Another problem in spreading out thermoelectric elements is that the rigid connection of elements over large distances causes them to rupture due to sheer stress upon thermal expansion of the hot side relative to the cold side. To solve this problem, other designs have been proposed that use a flexible plastic such as polyimide for the circuit boards, but these materials are too porous to maintain a vacuum.

Another disadvantage of the prior art design of thermoelectric modules is that the high density of heat moved to the hot side results in a temperature gradient through the heat sink, and this temperature delta subtracts from the overall cooling that the module can achieve. In particular, traditional thermoelectric products are not able to reach true refrigeration temperature because of this temperature gradient.

Finally, because prior art thermoelectric modules are placed in a solder reflow oven during assembly, only high-temperature materials may be used. Unfortunately, many desired uses of cooling and heating involve close or direct contact with the human body, for which soft materials, such as cushions, cloths, and flexible foam are preferred, but these materials cannot withstand the high temperatures of a solder reflow oven.

Thermoelectric devices can be as efficient, or even more efficient, than vapor compression cooling systems when the temperature delta is 10 degrees C. or less. For this reason, a strong desire exists to deploy thermoelectric technology for local heating and cooling of occupied spaces and thereby reduce the overall energy consumption needed for personal comfort. The total energy savings of the central A/C or heating system plus the local thermoelectric systems can be 30% or more for such a combination, but the unwieldy implementation of prior-art thermoelectric modules inhibits their use for this purpose.

Hence, the need exists for a variety of insulating panels to be safely and comfortably improved with thermoelectric capability, such as seat cushions, mattresses, pillows, blankets, ceiling tiles, office/residence walls or partitions, under-desk panels, electronic enclosures, building walls, solar panels, refrigerator walls, freezer walls within refrigerators, or crisper walls within refrigerators.

Power Generation

Devices that generate electricity from renewable sources all have limitations. The ideal power generation technology supplies power 24 hours per day, is low cost, and uses only energy from renewable sources, such as wind, tidal and wave, sunlight, or geothermal pools. The two most common forms of utility-scale renewable power generation are wind turbines and photovoltaic systems.

Photovoltaic (PV) technology has the following limitations: (1) high cost, (2) generates power only when the sun is shining brightly which is less than 33% of the time, (3) introduces transients into the electrical grid when clouds suddenly block the sun, and (4) low efficiency without concentration or dangerous temperatures and light levels with concentration.

Wind turbines have the following limitations: (1) relatively high cost, (2) generates power only when the wind is blowing which is less than 33% of the time on average, (3) introduces transients into the electrical grid when the wind suddenly stops or changes direction, (4) requires very tall and visually unacceptable structures, (5) generates noise, (6) has a random peak capacity time during the day that rarely matches the peak demand time, and (7) has very low land usage at about 4 Kwatts per acre.

Both PV and wind turbines may be supplemented with large batteries to store energy for periods of time when the renewable source is not available, but such storage is very expensive at about $1000 per Kwatt hour. When combined with battery storage to achieve 100% renewable generation, the cost for a renewable PV or wind turbine plant is around $20 per watt, vs. about $10 per watt for a fossil fuel pant including 10 years of fuel costs.

Tidal and wave energy installations require high capital startup costs, and like wind turbines, suffer from variable output and may be usually unacceptable structures if erected near shorelines.

Hence, the need exists for a low-cost electrical power generation capability that can supply power 24 hours per day, 7 days per week, and 365 days per year and only tap renewable energy sources. One preferred embodiment of the invention thermoelectric string and associated panel described herein can accomplish these goals.

SUMMARY OF THE INVENTION

Broadly speaking, this invention makes possible thermoelectric capability for a variety of panel materials and enables local/personal heating and cooling that reduces overall energy consumption. In one aspect this invention provides a thermoelectric string that can be woven or inserted into a variety of such panels, including soft and low-temperature panels. In another aspect, this invention also eliminates the need for a large, bulky, heavy, and expensive heat sinks and fans to dissipate heating and cooling. In one aspect this invention combines hardware that moves electrical current with hardware that dissipates thermal energy, thereby saving cost over embodiments such as U.S. Pat. No. 3,196,524. In another aspect this invention provides a common set of hardware to provide low thermal back flow near the thermoelectric elements and simultaneously provide high thermal conduction to ambient air away from the elements. In one embodiment this invention provides a thermoelectric string that can be routed through small holes in the panel to minimize thermal leakage. In another embodiment this invention eliminates the need for vacuum enclosures such as U.S. Pat. No. 3,225,549 of highly-distributed thermoelectric elements and also eliminate the need for wicking fluids such as US 2010/0107657. In a particularly preferred embodiment this invention provides cooling capability and electricity generation for pennies per watt in manufacturing cost.

BRIEF DESCRIPTION OF THE DRAWINGS

Features and advantages of the present invention will be seen from the following detailed description taken into conjunction with the accompanying drawings wherein like numerals depict like parts, and wherein.

DETAILED DESCRIPTION OF PREFERRED EMBODIMENTS

Figure 1:
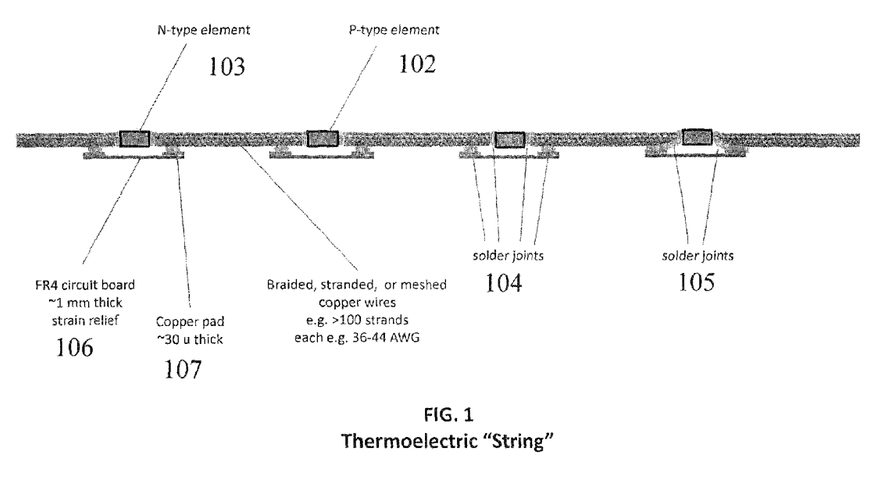
FIG. 1 is a string showing the thermoelectric elements connected by lengths of braided wire.

A preferred embodiment of this invention includes a string containing alternating P-type 102 and N-Type 103 thermoelectric elements connected by lengths of braided or stranded wire 101 as shown in FIG. 1. The thermoelectric elements preferably comprise metals, although non-metallic conductors such as graphite and carbon may be used. In one embodiment, the alternating elements can be small crystals of, e.g. Bismuth Telluride (N-type) 103 and, e.g. Antimony Bismuth Telluride (P-type) 102, possibly plated with, e.g. Nickel and/or Tin on the ends to facilitate solder connections 104 or 105, or can be small thermo-tunneling vacuum tubes. Because the thermoelectric elements or tubes may be fragile, a "strain relief", made of a stiff material 106 like FR4 combined with copper 107 and solder 104 or 105 bonds prevents a pulling force on the wire from breaking the elements or vacuum tubes. The aggregate diameter of the stranded or braided wire is designed to carry the desired electrical current with minimal resistance.

Figures 2, 2A:
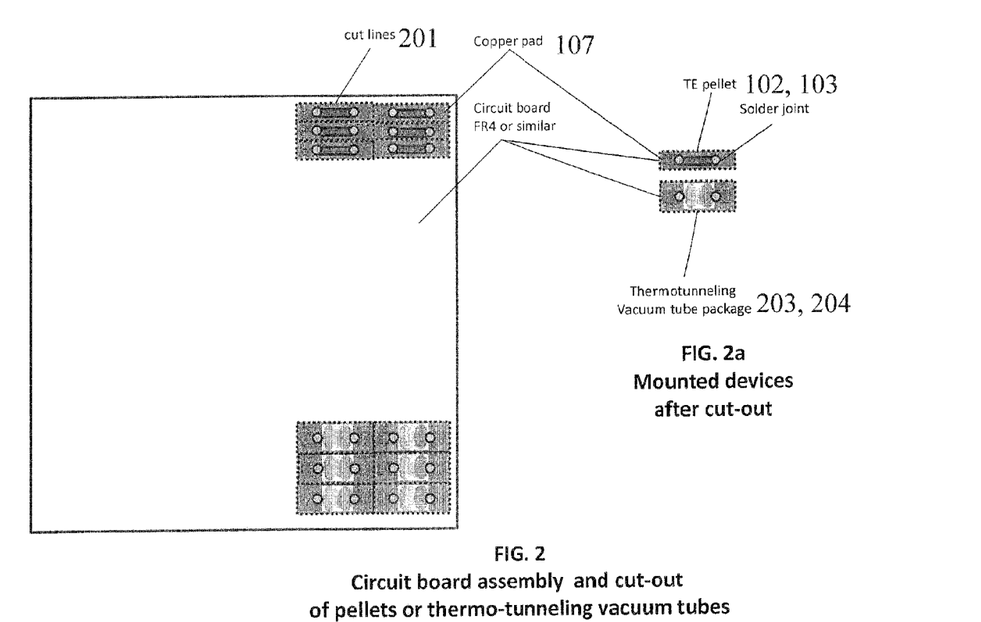
FIG. 2 illustrates a method of assembling the thermoelectric elements on strain reliefs using a standard circuit board manufacturing process.

FIG. 2 shows how subassemblies of this thermoelectric string might be fabricated using standard circuit board assembly techniques and machinery. A large FR4 circuit board 202 is patterned with the copper pads 107 of the strain reliefs 106 of FIG. 1. A packed arrangement is used to assemble the pellets 102 and 103 or tubes 203 and 204 onto the board. An assembly robot can place the thermoelectric elements or tubes and place solder paste 104 at the appropriate joints. The whole assembly is run through an oven to flow the solder and then cooled to harden the solder joints. Once assembly is completed, the strain relief assemblies are cut out along the cut lines 201 to leave the thermoelectric elements mounted on the strain relief 106.

The lower portion of FIG. 2 shows how the invention can also apply to the latest advanced thermo-tunneling devices. Such devices are more efficient, but require packaging in a vacuum tube. These small vacuum tubes can substitute for the thermoelectric elements 102 and 103 of FIG. 1 and can also benefit greatly from the strain reliefs 106 of FIG. 1 and FIG. 2. Since a useful vacuum package must have a thin glass wall to minimize thermal conduction, it will also likely be very fragile.

Figures 3, 3D:
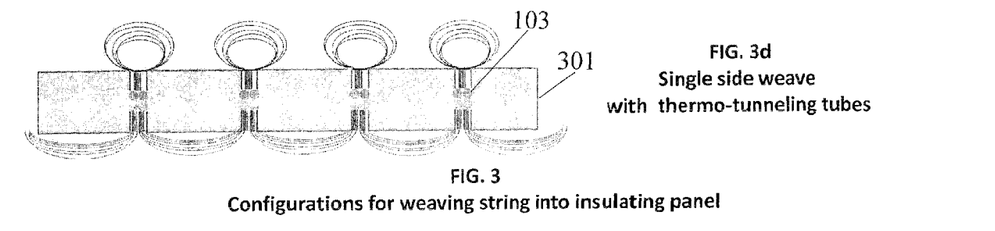
FIG. 3 illustrates how the braid of FIG. 1 is woven into an insulating panel.
Figure 3A:
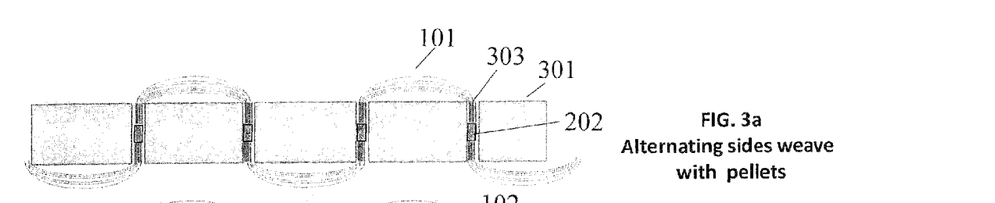
Figure 3B:
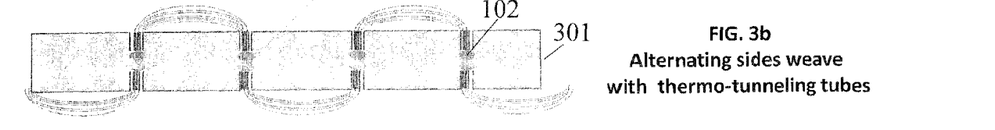
Figure 3C:
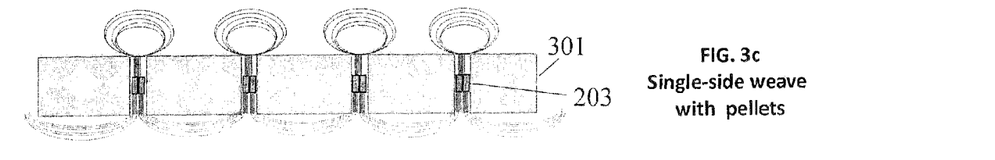

The thermoelectric elements of FIG. 1 alternate between N-type 103 and P-type 102 in order to move heat in the same direction while the current flows back and forth along the string woven into a panel 301 as shown in FIG. 3. One purpose of compacting the wire strands in the string of FIG. 1 is to be able to route the string through small-diameter holes 302 in the panel. The hole diameter should be small to minimize thermal leakage that compromise the insulating capability of the panel material. Another purpose of compacting the wires near the elements is to minimize the area for heat to backflow from the hot side of the element to the cold side of the element. The string may be woven into the panel 301 in an alternating fashion as illustrated in FIG. 3a and FIG. 3b. Or, the N-type and P-type elements may be paired together to allow the string to be pushed though the holes 302 from one side as illustrated in FIG. 3c and FIG. 3d. The single sided approach in FIGS. 3c and 3d facilitates manufacture of the panel from one side rather than having to work with both sides as in FIGS. 3a and 3b.

Another embodiment is when the compacted portions 303 of the string within the panel holes of FIG. 3 are replaced with solid cylinders made of copper or similar metal and these cylinders are attached to the thermoelectric element on one end and the expanded wire 101 on the other end. This approach would facilitate robotic placement of the cylinders and elements in the holes in an electronic assembly operation.

Yet another embodiment is to weave or assemble the string into a mold instead of the panel of FIG. 3, then injection-mold the panel material into the mold. Upon removal of the mold, a similar configuration to FIG. 3 is obtained.

In the embodiment of FIG. 3, the thermoelectric elements or tubes are spaced apart over a larger area vs. prior art modules, but the hot and cold sides are also separated by a length much longer than the elements. Since heat backflow conduction is proportional to area/length, scaling both simultaneously maintains a similar overall heat backflow as prior art thermoelectric modules. Since many desirable insulating panels like Styrofoam™, cloth, etc. have thermal conductivities comparable to air, the conduction ability of the invention's panel is comparable to that of the air cavity in prior art modules. In addition, the presence of the opaque panel blocks heat backflow from radiation almost entirely.

Once woven or placed, the exterior metal 101 in FIG. 3 is expanded, if necessary, on the hot and cold sides of the panel in order to maximize the exposure of the metal to air, which in turn maximizes its heat sinking or absorbing capability in either a natural or forced-air convection environment.

A key element of this invention over the prior art is re-optimizing the heat sinks for natural convection vs. the forced-air convection. With the prior art forced-air convection systems, usually based on a fan, the forced air is moving in one direction only. Hence, the optimal heat sink is a metal plate for spreading the heat and linear metal "fins" for distributing the heat along the direction of the forced air. So, in prior-art forced air systems, the optimal heat sink maximizes the area touching air along the airflow, as represented by the parallel fins commonly used.

For a natural convection environment, the air flow velocity is much less than with a fan, but the air has the ability to move in all directions. Hence, the optimal heat sink for a natural convection environment is one that maximizes the area touching air in any direction.

In this preferred embodiment, re-optimizing the heat sink for natural convection brings about the following advantages: (1) better uniformity of the absorption of heat on the cold side and of the dissipation of heat on the hot side, (2) silent operation by eliminating the need for a fan, (3) much less total metal required, (4) more reliable because fans are prone to failure, (5) more efficient because the temperature change across the heat sink can be recovered to provide better additional cooling.

A typical prior-art thermoelectric module deployment has a heat sink with fins that are typically 2 mm thick. Because two surfaces of the fin are exposed to air, the total cross section perimeter of exposure is 4 mm for each thermoelectric element. In the preferred embodiment of this invention, the aggregate diameter d of the compacted wire is 1 mm. However, when the strands are spaced apart on the hot or cold side as shown in FIG. 3, the total cross section perimeter exposed to air is now $N\pi(d/N^{1/2})$ where N is the number of strands and d is the aggregate diameter. As stranded wire is easily available with 100-400 strands, then total cross section exposed to air for the invention is 31.4-62.8 mm, more than seven times the exposed cross section for prior art devices. Because of this larger cross section of exposure, the heat dissipation and absorption capacity of the invention can be, depending on geometric parameters, sufficient to eliminate the need for a fan as well as a rigid heat sink and rely instead only on natural convection. In addition, the larger amount of area touching air by the use of strands reduces the total amount of metal required for heat dissipation, facilitating lightweight, soft, and wearable panels.

Furthermore, the number of strands in FIG. 3 may be increased almost arbitrarily while the diameter of each strand is proportionately decreased. As above discussed, more strands leads to increased heat absorption and dissipation by factor $N^{1/2}$ with natural convection. Thinner strands also allows for the heat sink of the invention to be soft, lightweight, and flexible in contrast to rigid, hard, and heavy heat sinks of the prior art. Wire braid of tinned copper with 72-400 strands is typically used in the electronics industry, and such braid is designed to be expandable in order to serve as shielding of cables of varying diameter. Each strand in these braids is AWG 36 or about ~100 microns in diameter. Another type of braid, wick-braided copper, is used to remove solder and its strands are even thinner, making possible a very soft device for dissipating heat and carrying electrical current in a thermoelectric panel when the strands are spread apart. Copper mesh is also readily available with even thinner strands of 44 AWG and spread out in 140 strands per inch when fully expanded.

Without limitation, the panel 301 in FIG. 3 may be Styrofoam™ (polystyrene foam), natural cloth, synthetic cloth, natural sponge, synthetic sponge, polyurethane, fiberglass, foam glass, building insulation material, wood, paper, cotton, batting, pipe-wrapping insulation, ceiling tile material, memory foam, cushion material, or any other insulating material.

Figure 4A:
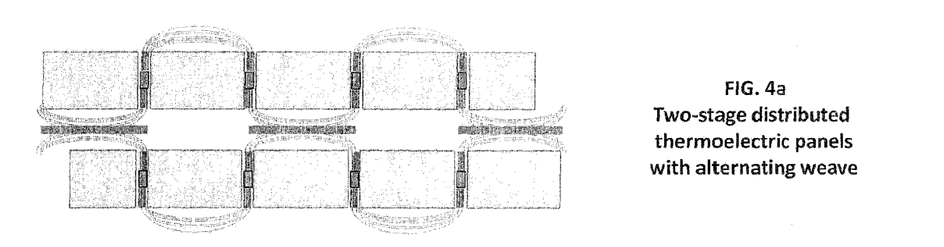
FIG. 4 illustrates how multiple layers of panels as described in FIG. 3 can be cascaded in order to more efficiently achieve a high temperature difference.
Figure 4B:
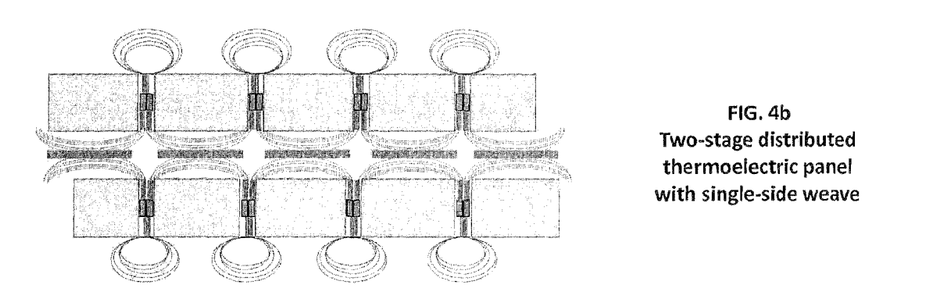

In some cases, it is desirable to have multi-stage thermoelectric cooling and heating. Higher temperature deltas are achievable. Prior art modules often are stacked with 2 to 4 stages to achieve the very low temperatures needed for sensitive imaging cameras. The same multi-staging is possible with this invention and provides similar benefits, as illustrated in FIG. 4. Here, two panels 301 are connected thermally in between by thermal connectors 400 that have high thermal conduction and electrical isolation. The thermal connectors may contain copper solder pads 401 and an electrically insulating layer like polyimide 402. In this configuration, the polyimide layer 402 is so thin that its thermal conduction is high. Without limitation, the electrical insulator could be FR-4, Kapton (polyimide), Teflon (polytetra-fluoroethylene), an insulated metal substrate circuit board, aluminum oxide or any other readily available material. The multi-stage configuration may be applied to the alternating weave as shown in FIG. 4a or to the single-sided weave as shown in FIG. 4b. The thermoelectric elements are shown as pellets 102 and 103 but could also be thermo-tunneling tubes 203 and 204 shown in FIGS. 2 and 3.

Figure 5:
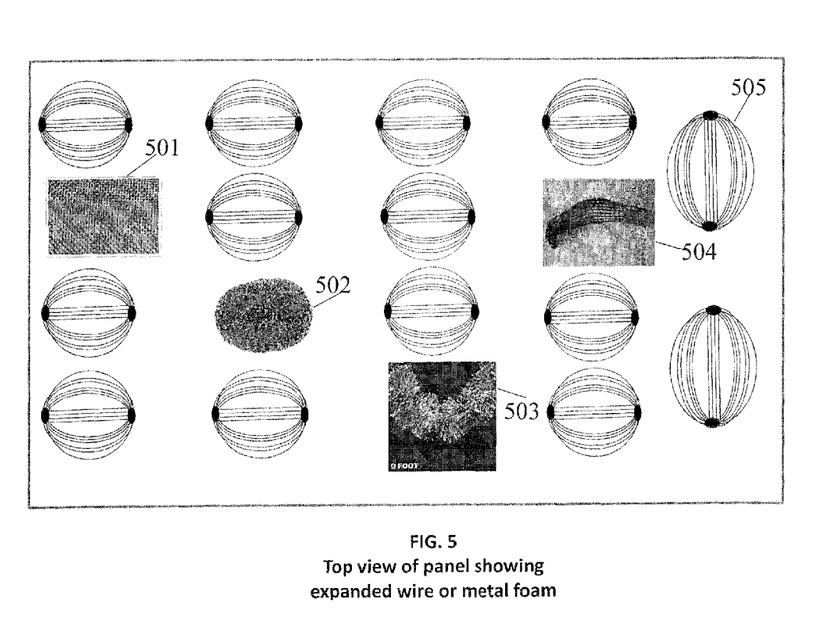
FIG. 5 illustrates how multiple metal materials can serve as an expandable heat sink or heat absorber.

FIG. 5 shows several different types of expandable metal conductors that may replace the braid 101 in FIGS. 1, 3 and 4. Copper mesh is available in an oriented form 501 or un-oriented form 502 and either provides strands with high contact area to air. Metal tinsel 503 has a thick central wire which is convenient for moving electricity from one thermoelectric element to the other plus many branches of thin copper strands which are convenient for dissipating or absorbing heat to or from the air. Flat braid 504 is also available with or without solder joints on either end. A panel made with one or a combination of these expanded metals 505 becomes a fully functional thermoelectric panel.

Figure 6:
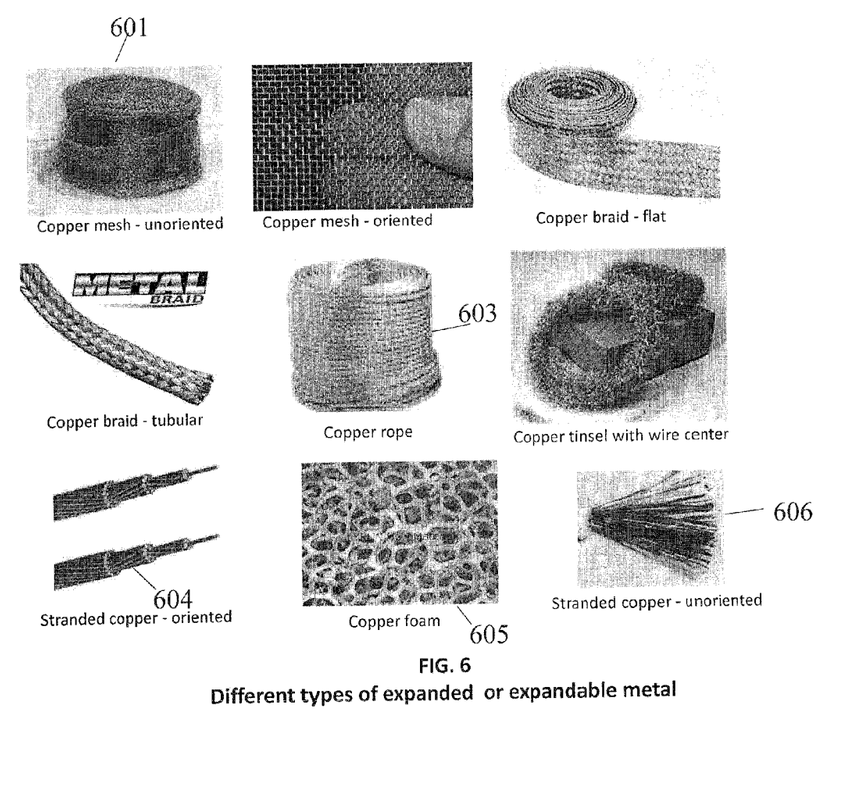
FIG. 6 illustrates a more exhaustive list of possible expandable metals.

FIG. 6 shows even more possibilities for expanded or expandable metals, including another type of un-oriented copper mesh 601, copper strands weaved like rope 603, coaxially grouped strands 604, copper foam 605, or loose copper strands 606. For the metal screen or mesh, the metal may be compacted by rolling tightly or folding tightly in an accordion shape near the thermoelectric elements, and loosening the roll or the folds away from the thermoelectric elements.

The thermoelectric panels described can also be deployed for generating electricity from heat. When heat is applied to one side, a Seebeck voltage is generated that can be used for electrical power. The heat source can be a selective surface receiving sunlight, a road or highway surface, geothermal heat, engine heat, smokestack heat, body heat, waste heat, and many other possibilities.

EXAMPLE 1

A Thermoelectric Cooler using Invention

Figure 7A:
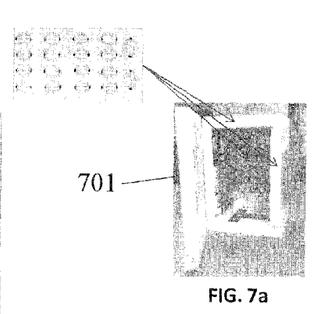
FIG. 7 illustrates one way that the invention was reduced to practice and cooling performance was measured and compared to the prior art.
Figure 7B:
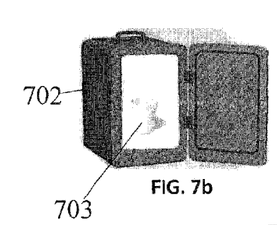
Figure 7C:
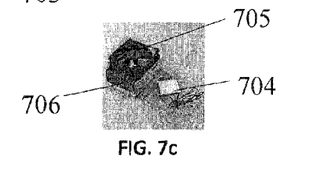

FIG. 7a illustrates a thermoelectric cooler 701 using the invention. Four thermoelectric panels 505 were built using a string as shown in FIG. 1 with braid 101 lengths 7 and 11 cm for the cold and hot sides, respectively. The panels were 1-inch (2.54 cm) thick Styrofoam™ 301 with 3 mm diameter holes and a pellet spacing of 3 cm. A total of 256 pellets were inserted into the four populated panels. The four thermoelectric panels were combined with two plain Styrofoam™ panels to construct a small cooler. The invention cooler 701 in FIG. 7a did not contain a heat sink or a fan and was powered with 20 watts of electricity.

The invention prototype of FIG. 7a was compared with a prior art commercial cooler 702 that contains a prior art thermoelectric module 704 also with 256 pellets, a prior art heat sink 706, and a prior art fan 705. This commercial cooler was powered as designed with 40 watts of electricity.

Figure 7D:
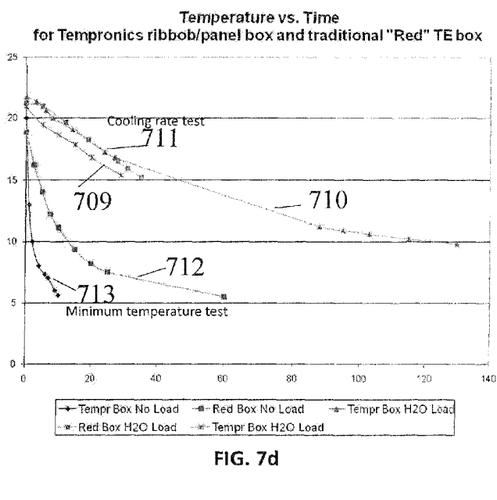

FIG. 7d shows the data taken during an experiment to compare the invention cooler with the prior art commercial cooler. The two key measures of performance for such a cooler are (1) the rate of cool-down for a room-temperature cup of water 703 and (2) the minimum temperature reached by the air inside each cooler. The graph 707 in FIG. 7d plots the temperature of on the Y-axis and the elapsed time in minutes on the X-axis.

The experiment revealed that the cooling-down rate for the cup of water, indicated by the slope of the line 709 and 711 for the invention, was comparable to the cooling-down rate of the prior art commercial cooler, indicated by the slope of 710. In addition, the minimum temperature of the air inside the box reached 5.5 degrees C. for both the invention cooler as indicated by line 713 and for the prior art cooler 712.

The data in FIG. 7d indicates that the invention performs as well as the prior art commercial cooler in cooling. However, the invention only required 20 watts of power vs. 40 watts for the prior art commercial cooler. Hence, the invention achieved the comparable performance with significantly greater efficiency. The greater efficiency is due to the following: (1) not needing the electrical power for a fan, (2) recovering much of the temperature drop across the heat sink, and (3) better distribution of the cooling over the walls of the container.

Figure 8:
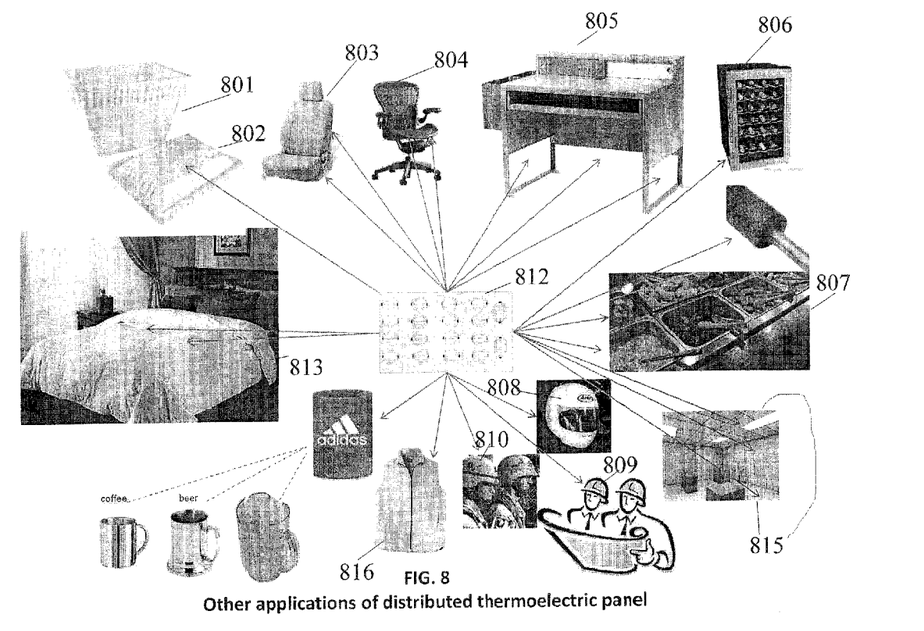
FIG. 8 illustrates, without limitation, many of the applications for the panel of FIG. 3 or FIG. 4 for heating and cooling functionality.

The thermoelectric panels of the invention illustrated in FIG. 3 and FIG. 4 are generalized insulating panels with the ability to cool or heat one side relative to the other. These generalized panels may be manufactured using a similar process and with similar machines and then deployed in a plurality of applications. Without exception, some of these applications are illustrated in FIG. 8.

In order to save overall energy or achieve greater individual comfort in cooling or heating the human body, one advantageous technique is to allow for local heating or cooling relative the environment. For example, the thermoelectric panel of the present invention may be placed around the cavity under a desk 805 as illustrated in FIG. 8 to provide local comfort for an office worker with significant energy savings. Or, the panel could be placed in an office chair 804 in the seat bottom or the seat back or both. In a vehicle, the panels may be placed in the seat bottom or seat back of a car seat 803. For sleeping, these panels may be placed in an electric blanket 813 combined with a thermostatic controller to maintain a desired under-blanket sleep temperature. The control electronics for the blanket can automatically switch the electrical current in the proper direction when cooling is needed to achieve the set temperature or when heating is needed. Without limitation, such thermostatic control can be applied to any of the applications of the invention including all of those illustrated in FIG. 8.

For individuals that must wear helmets, the body heat confined inside the helmet can be uncomfortable. Or, the helmet may not provide sufficient warmth when worn in cold environments that require head protection. The thermoelectric panel of the present invention may be molded into the proper shape to add cooling and heating capability to helmets of all types, including motorcycle or bicycle 808, military 810, or hard hats 809 for construction sites.

Similarly, the invention panel may be shaped and used to make clothing like vests 816 or, without limitation, other types of clothing such as coats, pants, pant legs, and shirts.

The thermoelectric panel of the present invention also can be used to cool food and drinks or other objects. These panels can be deployed as the wall, door, back, or top of a wine chiller 806 or a camping cooler 801 and 802. Because the panel and string can be flexible 812 in FIG. 8, it can be wrapped around shaped objects like water pitchers, beer or other mug or bottles, coffee drinks, milk or cream bottles or cartons, etc.

The thermoelectric panel of the present invention also may be deployed to heat or cool buffet trays 807 shown in FIG. 8 for self-serve restaurants, cafeterias, or catering services. The prior art uses ice to cool the trays and boiling water to heat them. The supply of ice and hot water must be maintained and the reservoir under the trays must be replenished periodically. The present invention provides benefits over the prior art by heating or cooling the trays electrically and not requiring cold and hot supplies.

The thermoelectric panel of the present invention also may be deployed in residences and buildings, A portion of a wall or window or floor 815 may be replaced by the panel of the present invention and provide heating or cooling for room. The ceiling tiles 815 in buildings also may be replaced by the panels of the present invention to provide heating and cooling for the space underneath the ceiling. The panel of the present invention also may be employed in combination with central compressor-based air conditioning systems to eliminate the need for forced air that can carry germs and smells from one room to another. In this case, the panels of the present invention would be mounted along plenums with the hot side facing into the plenum. The cool air from the compressor-based HVAC system would carry the heat away from the hot side while the cold side of the panel removes heat from the room. In this case, the room is cooled without forced air.

In another aspect, the invention, provides renewable electrical power from the sun's radiation in well-suited climates. A second purpose is to continue providing energy when the sun is not shining and all night long. A third purpose is to improve the land utilization as measured in Kwatts/acre to many times higher than a wind turbine farm. A fourth purpose is to provide peak power capacity at a time of day that better matches the typical peak demand time for electricity. A fifth purpose of this invention is to use inert and non-toxic materials to store the energy of the sun in the form of heat. A sixth purpose is to provide these capabilities at a cost per watt that is a fraction of the cost (including fuel costs) of a traditional power plant and an even smaller fraction of the cost per watt of a PV or wind turbine plant (including battery storage costs). As discussed below, the invention demonstrates better performance over prior art implementations that do not have energy storage such as U.S. Pat. No. 3,088,989, by additionally distributing the thermoelectric elements to match the heat distribution from un-concentrated sunlight and remove the need for metal heat spreaders.

Figure 9:
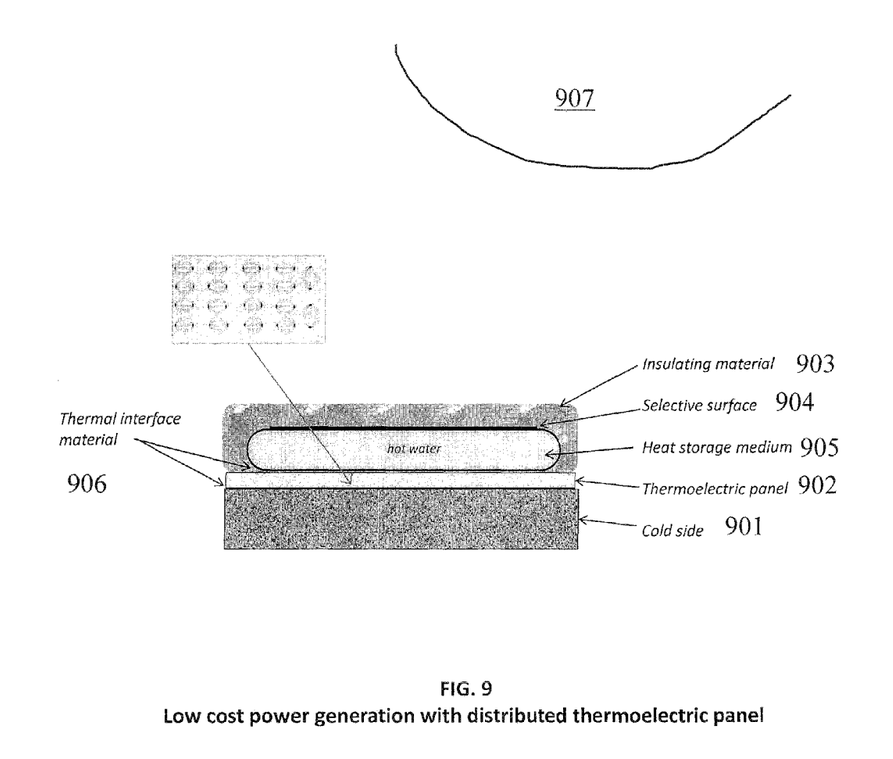
FIG. 9 illustrates one application for the panel of FIG. 3 or FIG. 4 for generating electricity from a heat storage medium heated by the sun.

An embodiment of the invention is illustrated in FIG. 9. An insulating material 903 that is largely transparent to the sun's radiation surrounds heat storage medium 905. The insulating material 903 also prevents the heat from escaping when the sun 907 is not shining. The insulating material may be, without limitation, bubble wrap, glass or Plexiglas sealing in air or air pockets, or any of the materials used for solar covers for swimming pools. A selective surface layer or coating 904 of the heat storage medium is designed to absorb radiation from the sun and prevent radiative re-emission of absorbed heat. This selective surface layer or coating 904 may be constructed, without limitation, from, e.g. an oxide of copper, aluminum, or iron, from carbon, steel or a combination or alloy of these, black paint, or similar materials used in solar ovens, solar camping showers, or solar rooftop water heaters. The heat storage medium 905 contains a large volume of a material with a high heat capacity. This material could be water, which has a volumetric heat capacity of 4.2 joules/cm$^3$/° C. or could be scrap iron which has a heat capacity slightly less than water. The selective surface 904 and the heat storage medium 905 are in good thermal contact. This contact possibly employs a thermal interface material 906 there between that has high thermal conductivity, the ability to mate the surfaces, and the ability to spread the heat. The heat storage medium 905 is thermally connected to the hot side of a distributed thermoelectric panel 902, again possibly employing a thermal interface material 906. The distributed thermoelectric panel 902 is an insulating panel with thermoelectric elements inside, as described in FIG. 2 and FIG. 3. The cold side of the thermoelectric panel 902 is thermally connected to ground 901 or floating on a body of water such as an ocean, lake, or pool.

Without limitation, the power generator illustrated in FIG. 9 could generate power only when the sun 907 is shining, eliminating the need for storage medium 905. In this case the selective surface 904 would be adjacent to the thermoelectric panel 902, possibly with a thermal interface material 906 there between.

Again without limitation, the power generator of FIG. 9 could employ a heat source other than sunlight. The water in the storage medium 905 could flow from an active geothermal source, or be heated waste water from a power plant or factory. If the thermoelectric panel 902 were built in the flexible configuration described earlier, then it could be wrapped around pipes carrying hot water or hot gases and generate electricity as illustrated in FIG. 8, item 814.

EXAMPLE 2

Solar Power Storage and Electricity Generation

An example power generator in accordance with FIG. 9 will now be described that is competitive with other power generators such as wind turbines and photovoltaic panels. The heat storage medium 905 is 2 m×2 m×0.3 m and is assumed to reach a peak of 100° C. This temperature does not exceed the boiling point of water, and is a temperature easily reached by insulated solar ovens used to cook food. The cold side 901 temperature is assumed to be room temperature or 20° C. The delta temperature $\Delta T$ across the thermoelectric panel 902 is then 80° C. and the average temperature is 60° C. The heat storage medium at a temperature elevated by 80° C. relative to ambient stores 4.0 E+8 joules or 112 Kwatt-hours if the heat capacity of water at 4.2 joules/cm$^3$° C. is assumed.

The insulating material 903 dimensions are 2 m×2 m×0.05 m, and so the thermal loss through the thickness of the insulator at the $\Delta T$ of 80° C. is 147 watts if a typical thermal conductivity of air-pocket insulators of 0.023 watts/m° C. is assumed.

Thermoelectric elements are readily available with an electrical resistance r of 0.005 ohm, thermal conductance K of 0.009 watts/° C., and Seebeck coefficient S of 300 µV/° C.

These values indicate a thermoelectric performance $ZT=S^2T/rK$ at the average temperature of 60° C. (333K) of 0.60, which is well within the performance claimed by most manufacturers.

The distributed thermoelectric panel 902 is 2 m×2 m×0.05 m, and it contains 1333 thermoelectric elements. The elements are spaced apart by 5.5 cm in each lateral direction. The total thermal loss through the elements is 960 watts (1333$\Delta$TK). The total voltage V generated by the elements connected in series is 1333S$\Delta$T or 32 volts. The total resistance of the elements, all connected in series, is R=1333 r=6.7 ohm. Assuming a matched load of 6.7 ohm, then the current flow I is V/2R or 2.4 amps. Hence, a total of 38.4 watts (0.5 VI) of power is available to the load by this example embodiment.

The sun's 907 radiation is known to be about 1000 watts/m$^2$, which indicates that 4000 watts reaches the selective surface 904. After subtracting the loss through the thermoelectric elements and through the insulating material, 2893 watts (4000−960−147) is absorbed as heat in the heat storage medium 905. Because 4000 watts are entering the medium for 8 hours of the day and 1145.4 watts (960+147+38.4) are leaving the medium for 24 hours of the day, more energy (net 4.52 Kwatt hours per day) is entering per day than is leaving, allowing for this embodiment to reach and maintain a maximum temperature. The heat builds up in the heat storage medium until it reaches its heat capacity of 112 Kwatt hours. The time required to reach the maximum temperature is about 25 days (112 Kwatt hours/4.52 Kwatt hours per day).

While this embodiment is less than 1% efficient on an instantaneous basis (38.4 watts generates/4000 watts available from the sun), which is a conservative expectation for a thermoelectric generator at these temperatures, making use of the heat storage allows the thermoelectric device to be about 3% efficient on a daily average basis.

A feature and advantage of this embodiment is that it reaches its maximum temperature in the mid-afternoon hours as heat builds up in the heat storage medium 905. Hence, the time of maximum power output of this embodiment better matches the time of peak demand for electricity. Photovoltaic panels have their maximum output at noon, which is two hours earlier than the peak demand. The daily maximum output of wind turbines is unpredictable.

With this embodiment, 38.4 watts of electrical power generated in a 2 m×2 m area corresponds to 38 Kwatts per acre, which compares very favorably to wind turbines which average about 4 Kwatts per acre.

Another feature and advantage of the present invention is that the storage medium, water, of this embodiment, is essentially free as the water does not even need to be fresh water. Storing energy as heat is much less costly than storing energy as electricity, and it may be stored without the toxic chemicals found in batteries.

Various changes may be made in the above, without degrading from the spirit and scope of the present invention.

We claim:

1. A thermoelectric panel, comprising:

An insulating substrate comprising a plurality of holes; and

A plurality of discrete semiconductor thermoelectric elements comprising p-type and n-type semiconductor elements;

Wherein the p-type and n-type semiconductor thermoelectric elements are woven in and out of the holes in the insulating substrate;

Wherein the p-type and n-type semiconductor thermoelectric elements are alternatively arranged in the holes in the substrate;

Wherein the p-type and n-type semiconductor thermoelectric elements are thermally and electrically connected to each other by stranded, braided, or mesh wire conductors comprising a plurality of strands of wire; and Wherein each of the stranded, braided or mesh wire conductors is compacted in cross section in the holes in the substrate near where the stranded wire conductors connect to the p-type and n-type semiconductor thermoelectric elements and the stranded, braided, or mesh conductors are expanded in cross section such that the strands are spaced apart from where the stranded wire conductors connect to the semiconductor thermoelectric elements, such that the compacted portion of the conductors are located in the holes in the insulating substrate and the expanded portions of the conductors are located outside the holes.

2. The thermoelectric panel of claim 1, wherein pairs of semiconductor thermoelectric elements having metal therebetween are pushed through a hole from one side of an insulating panel exposing a loop of expanded or expandable metal on the other side and retaining the semiconductor thermoelectric elements within the panel.

3. The thermoelectric panel of claim 1, wherein the insulating substrate is made of a material selected from the group consisting of natural cloth, synthetic cloth, natural sponge, synthetic sponge, polyurethane, fiberglass, foam glass, building insulation material, wood, paper, cotton, batting, pipe-wrapping insulation, ceiling tile material, memory foam, polystyrene foam and a cushion material.

4. A thermoelectric device comprising a thermoelectric panel of claim 1, incorporated into a seat cushion, seat back, blanket or blanket section, pillow, under-desk panel, ceiling tile, building or residence wall or floor or window, refrigerator or wine chiller wall or door, beverage or pitcher insulator, electronic enclosure wall, piece of wearable clothing or uniform, a helmet or a hat or a hardhat lining or a pipe containing fluid.

5. A thermoelectric device comprising a thermoelectric panel of claim 1 for generating electricity when heat is applied to one side.

6. The thermoelectric device of claim 5, wherein the heat comprises a heat source is selected from the group consisting of sunlight, geothermal heat, waste heat, body heat, animal heat, exhaust heat, engine heat, turbine heat, and pipe heat.

7. A thermoelectric device comprising a plurality of thermoelectric panels of claim 1, stacked together in thermally increasing order to achieve larger temperature differences.

8. The thermoelectric device of claim 7, wherein the plurality is a whole number equal to 2, 3, or 4.

9. The thermoelectric device of claim 7, wherein a plurality of thermoelectric panels are connected together and electrically isolated on a thermally conducting board or group of boards.

10. The thermoelectric device of claim 9, wherein the board is a circuit board or circuit boards.

11. The thermoelectric device of claim 9, wherein thermoelectric panels are electrically isolated by an electrical isolation material selected from the group consisting of FR4 and a polyimide.

12. The thermoelectric device of claim 9, wherein the thermoelectric panels are electrically isolated by an electrical isolation material which is thin or contains a metal substrate with thin isolation layers to permit high thermal conduction.

13. The thermoelectric device of claim 12, wherein the thin electrical isolation material is a polyimide or an oxide of a metal substrate, and has a thickness of 10 to 40 microns.

14. The thermoelectric device of claim 9, containing copper or other metallic pads to facilitate soldering of the expanded stranded wire conductors outside the stacked panels on either side of the board or boards.

15. The thermoelectric panel of claim 1, further including a strain relief for mounting the semiconductor thermoelectric elements in the panel.

16. The thermoelectric panel of claim 1, wherein the substrate is made of a circuit board substrate material selected from the group consisting of a polyimide, polyester, nylon, FR-4 and fiberglass.

17. The thermoelectric panel of claim 15, wherein the strain relief comprises copper or other metallic pads for solder-attaching the stranded wire conductors to the strain relief and to the semiconductor thermoelectric elements.

18. A method for forming a string of thermoelectric elements as claimed in claim 1, comprising a substrate, a plurality of discrete semiconductor thermoelectric elements contained within holes in the substrate, and connected to one another by stranded wire conductors, wherein each of the stranded wire conductors is compacted in cross section near where the stranded wire conductors connect to the semiconductor thermoelectric elements is expanded in cross section away from where the stranded wire conductors connect to the semiconductor thermoelectric elements, which comprises assembling a plurality of thermoelectric elements on a circuit board patterned with pads of the strain relief, and cutting the thermoelectric elements with strain relief assemblies from the circuit board.

19. A method for forming a string of thermoelectric elements as claimed in claim 1, comprising a substrate, a plurality of discrete semiconductor thermoelectric elements contained within holes in the substrate, and connected to one another by stranded wire conductors, wherein each of the stranded wire conductors is compacted in cross section near where the stranded wire conductors connect to the semiconductor thermoelectric elements is expanded in cross section away from where the stranded wire conductors connect to the semiconductor thermoelectric elements, wherein semiconductor thermoelectric elements are woven in and out of holes in an insulating substrate wherein portions of the stranded wire conductors within the holes in the panel are compacted and portions outside the holes in the panel are expanded, which comprises weaving strings of thermoelectric elements in a mold, injecting panel material into the mold, allowing the panel material to set, and removing the mold.

20. A thermoelectric panel as claimed in claim 1, comprising a string of semiconductor thermoelectric elements assembled from a plurality of thermoelectric elements on a circuit board patterned with pads for strain relief, and cutting the semiconductor thermoelectric elements with strain relief assemblies from the circuit board.

21. A thermoelectric panel as claimed in claim 1, comprising a string of semiconductor thermoelectric elements assembled into a mold and then injecting panel material into the mold, allowing the panel material to set, and removing the mold.

22. The thermoelectric panel according to claim 1,
wherein a cross section perimeter of the conductors exposed to air is $N\pi(d/N^{1/2})$, where N is the number of strands and d is an aggregate diameter of the strands.

* * * * *

UNITED STATES PATENT AND TRADEMARK OFFICE
CERTIFICATE OF CORRECTION

| | | Page 1 of 1 |
|---|---|---|
| PATENT NO. | : 8,969,703 B2 | |
| APPLICATION NO. | : 13/101015 | |
| DATED | : March 3, 2015 | |
| INVENTOR(S) | : Makansi et al. | |

It is certified that error appears in the above-identified patent and that said Letters Patent is hereby corrected as shown below:

On the Title page,

Item (57), second column, under ABSTRACT, line 12, "panel On" should be --panel. On--.

Page 2, item (56) under References Cited, U.S. PATENT DOCUMENTS, after line 3, add missing reference:
--3,225,549   12/1965   Elfving.................62/3--.

Signed and Sealed this
First Day of September, 2015

Michelle K. Lee
*Director of the United States Patent and Trademark Office*